(12) United States Patent
Barr et al.

(10) Patent No.: US 7,187,556 B2
(45) Date of Patent: Mar. 6, 2007

(54) POWER DISTRIBUTION SYSTEM

(75) Inventors: Andrew Barr, Roseville, CA (US); Ricard E. Espinoza-Ibarra, Carmichael, CA (US); Sachin Navin Chheda, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 362 days.

(21) Appl. No.: 10/684,646

(22) Filed: Oct. 14, 2003

(65) Prior Publication Data
US 2005/0078467 A1 Apr. 14, 2005

(51) Int. Cl.
H05K 7/02 (2006.01)
H05K 7/06 (2006.01)
H05K 7/08 (2006.01)
H05K 7/10 (2006.01)

(52) U.S. Cl. ................... 361/760; 361/683; 361/719

(58) Field of Classification Search ........... 361/749, 361/789, 816–818; 174/117 F, 117 FF, 254–258
See application file for complete search history.

(56) References Cited

U.S. PATENT DOCUMENTS

| | | | | |
|---|---|---|---|---|
| 3,914,531 A | * | 10/1975 | Zell et al. ........... | 174/36 |
| 5,051,868 A | * | 9/1991 | Leverault et al. ........ | 361/683 |
| 5,428,761 A | * | 6/1995 | Herlihy et al. ........... | 711/130 |
| 5,694,297 A | * | 12/1997 | Smith et al. ............ | 361/785 |
| 5,855,064 A | * | 1/1999 | Chang ................. | 29/861 |
| 5,980,267 A | | 11/1999 | Ayers et al. | |
| 6,290,514 B1 | | 9/2001 | McHugh et al. | |
| 6,356,448 B1 | | 3/2002 | DiBene, II et al. | |
| 6,402,556 B1 | | 6/2002 | Lang et al. | |
| 6,452,113 B2 | | 9/2002 | Dibene, II et al. | |
| 6,596,948 B1 | | 7/2003 | Haden et al. | |
| 6,617,518 B2 | * | 9/2003 | Ames et al. ........... | 174/254 |

(Continued)

OTHER PUBLICATIONS

Samaras, Bill, "The Itanium Processor Cartridge", 2000 Intel Corporation, pp. 1-29 (2000).

(Continued)

*Primary Examiner*—Tuan Dinh

(57) ABSTRACT

One aspect of the present invention provides a power distribution system comprising a first printed circuit board, a power supply, a processor, and a flexible cable connector. Both the power supply and the processor are mounted on the first printed circuit board. The flexible cable connector comprises a first end electrically connected to the processor and a second end electrically connected to the power supply. The flexible cable connector is configured with a length so that the power supply is in a spaced relationship relative to the processor. The flexible connector also extends between the power supply and the processor independent of the first printed circuit board. The flexible cable connector comprises a plurality of insulated power wires and a ground structure. The plurality of insulated power wires are arranged generally parallel to each other extending from the first end to the second end of the flexible cable connector. The ground structure includes a ground shield that surrounds the plurality of insulated power wires and extends from the first end to the second end of the flexible cable connector, with the ground structure configured to provide a return path for current between the processor and the power supply.

10 Claims, 5 Drawing Sheets

U.S. PATENT DOCUMENTS

| | | |
|---|---|---|
| 6,618,268 B2 | 9/2003 | Dibene, II et al. |
| 6,623,279 B2 | 9/2003 | Derian et al. |
| 6,862,184 B2 * | 3/2005 | Shi et al. .................... 361/719 |
| 6,940,477 B2 * | 9/2005 | Moon et al. .................. 345/87 |
| 2002/0171443 A1 | 11/2002 | Abazarnia et al. |
| 2003/0062602 A1 | 4/2003 | Frutachy et al. |
| 2003/0158400 A1 | 8/2003 | DiBene, II et al. |

OTHER PUBLICATIONS

Hewlett-Packard Company, "Inside the Intel Itanium 2 Process", Hewlett Packard Technical White Paper (Jul. 2002), pp. 1-43.

Prismark Partners LLC, "Power Demands in High-End Microprocessors", (Feb. 2002), pp. 1-15.

* cited by examiner

POWER DISTRIBUTION SYSTEM

BACKGROUND

Computer technology continues to compress greater amounts of computing power, memory and input/output signals in smaller and smaller spaces. As the computing speed of processors, such as central processing units increases, larger amounts of power are required. In addition, the rate change and level of current entering and exiting these processors must be managed very closely. These power and current requirements of today's high-end processors challenge conventional computer circuitry design.

For example, at one time it was previously acceptable to locate a power supply remote from a processor, as in desktop computers where space is relatively generous. Many, if not virtually all, connections between respective circuit modules are made via a printed circuit board on which the modules reside. Accordingly, the power demands of today's high end processors are so high that the power supply for these high-end processors must be located immediately adjacent the processor to avoid disruptive inductance loops through the printed circuit board that are created if the power supply is located remotely from the processor.

While physical coplacement of the power supply and high-end processor on the printed circuit board alleviates an inductance problem, this arrangement introduces a whole set of challenges. For example, the large bulky power pod occupies an important space on a circuit board—the space immediately adjacent the processor. High-end processors have a large number of circuit traces, which require space on the circuit board immediately adjacent the processor. Memory is also sometimes located immediately adjacent the processor. Accordingly, the physical coplacement of the power supply with the processor takes a significant amount of space that otherwise would go to memory, circuit traces, and other circuit elements.

For these and other reasons, conventional ways of placing processors, power supplies, memory, and other functions on a printed circuit board fail to meet the challenges of today's computing power and form factors.

SUMMARY

One aspect of the present invention provides a power distribution system comprising a first printed circuit board, a power supply, a processor, and a flexible cable connector. Both the power supply and the processor are mounted on the first printed circuit board. The flexible cable connector comprises a first end electrically connected to the processor and a second end electrically connected to the power supply. The flexible cable connector is configured with a length so that the power supply is in a spaced relationship relative to the processor. The flexible connector also extends between the power supply and the processor independent of the first printed circuit board. The flexible cable connector comprises a plurality of insulated power wires and a ground structure. The plurality of insulated power wires are arranged generally parallel to each other extending from the first end to the second end of the flexible cable connector. The ground structure includes a ground shield that surrounds the plurality of insulated power wires and extends from the first end to the second end of the flexible cable connector, with the ground structure configured to provide a return path for current between the processor and the power supply.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims. All such variations are within the scope of the present invention.

Embodiments of the present invention are directed to a flexible cable connector that distributes power in a low inductance path between a power supply and a processor. In one embodiment, this flexible cable connector enables the power supply can be located remotely from the processor. In one embodiment, the flexible power connector also removes this path for power from some of the power and ground planes of the printed circuit board that support the processor. Moreover, the low inductance path provided by one embodiment of the flexible power connector enables other components, such as memory and other circuit traces and elements, to be located immediately adjacent the processor.

Figure 1:
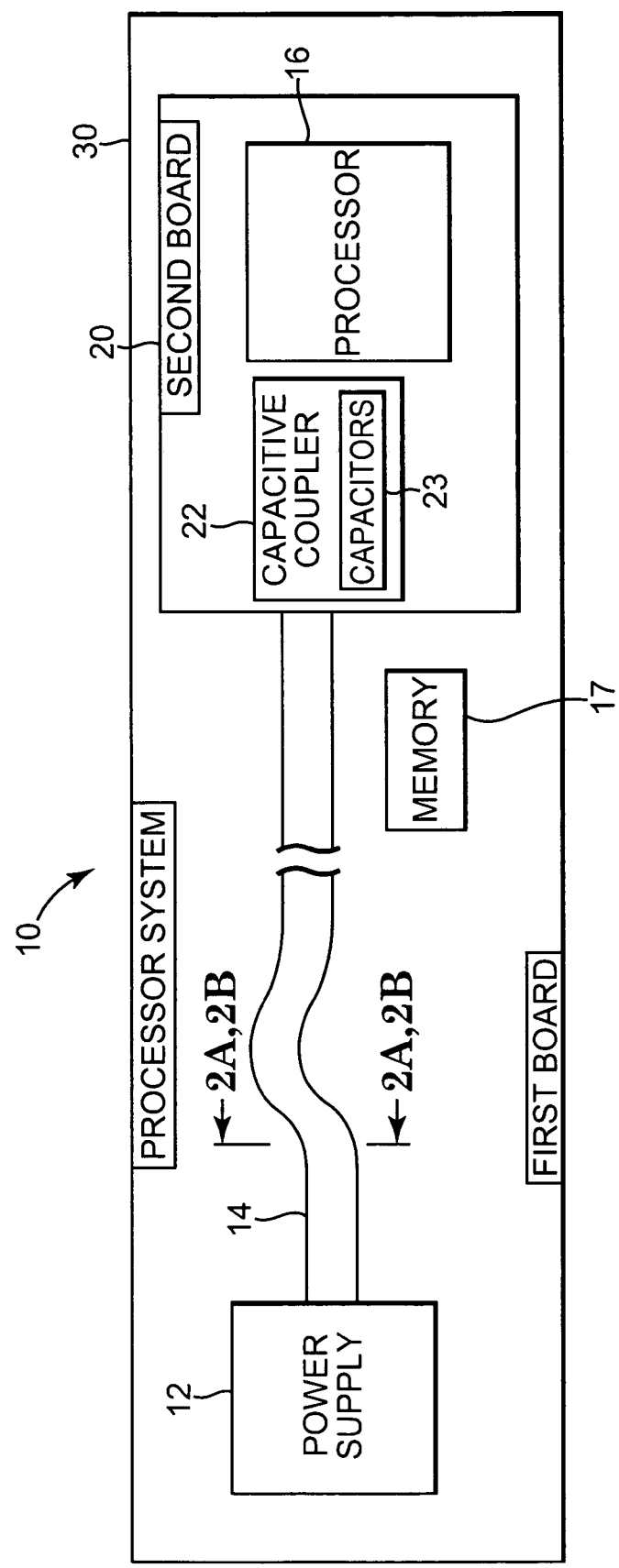
FIG. 1 is a plan view of a power distribution system including a flexible cable connector, according to an embodiment of the present invention.

One exemplary embodiment of the present invention is shown generally in FIG. 1 as system 10. System 10 comprises power supply 12, flexible cable connector 14, processor 16, memory 17, and first printed circuit board 30 (e.g.

motherboard), on which these system components are mounted. System 10 also comprises second printed circuit board 20 (e.g. daughterboard), which is mounted on first printed circuit board 30, and which comprises capacitive coupler 22 including a plurality of capacitors 23. However, in one aspect, power supply 12 is optionally located on a frame (e.g. chassis) remote from printed circuit board 30, as will be described in more detail in association with FIG. 3.

Processor 16 comprises a microprocessor or central processing unit (CPU), particularly those used in high density computing. One example of processor 16 includes a high-end processor, which has high power requirements and stringent current requirements (e.g. high step current criteria), and which conventionally receives power from a power pod (e.g. power supply) located immediately adjacent to processor 16. One example of processor 16 comprises a 64 bit Itanium processor from the Itanium Processor Family from Intel. Processor 16 is disposed on first printed circuit board 30 as part of a computer server, or workstation.

Power supply 12 is a power supply for operating processor 16, as well as other components of first printed circuit board 30 or server environment. In one aspect, power supply 12 is a power supply for a rack server, or other computer server/workstation. In another aspect, power supply 12 is a power supply for a blade server that is disposed on a blade chassis, separate from printed circuit board 30, for connecting to the blade server.

Second printed circuit board 20 comprises a mounting structure such as a daughterboard adapted for mounting processor 16 on first printed circuit board 30, which acts as a motherboard. Capacitive coupler 22 comprises a plurality of capacitors 23, such as high speed capacitors, adapted to provide capacitive coupling between flexible cable connector 14 and processor 16. Capacitive coupler 22 maintains a stable voltage for processor 16 and facilitates meeting the high current step requirements of processor 16.

Figure 5:
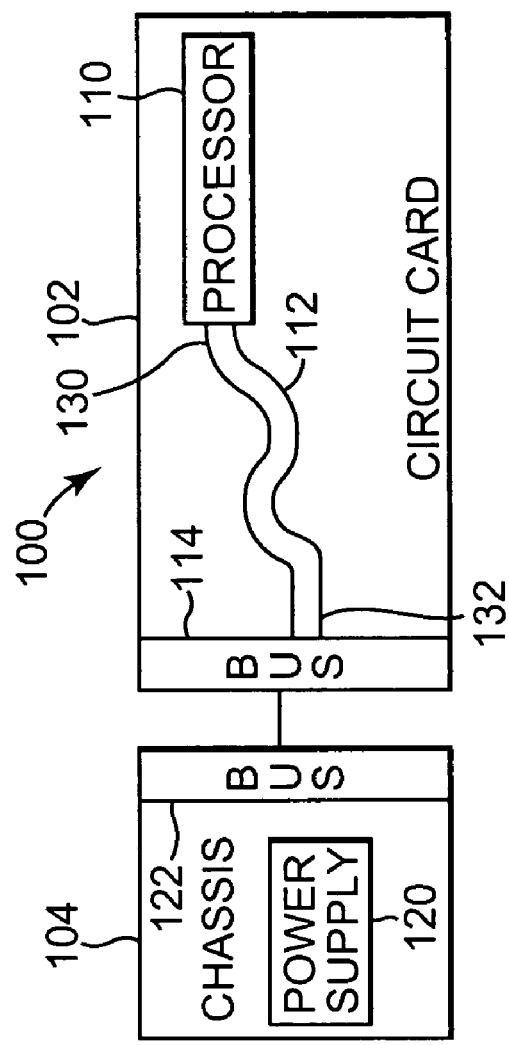
FIG. 5 is a plan view of a circuit card system, according to an embodiment of the present invention.

Second printed circuit board 20 is optionally omitted from system 10 so that processor 16 is mounted directly to first printed circuit board 30 in an arrangement substantially to that shown in FIG. 5, such as system 100, in which processor 110 is mounted directly to circuit card 102. In this aspect of system 10, capacitive coupler 22 is optionally mounted directly on first printed circuit board 30 for electrically coupling flexible connector 14 to processor 16.

Flexible cable connector 14 provides a low inductance path for distributing power transmission among a plurality of insulated power wires and a plurality of return ground wires between processor 16 and power supply 12. Each insulated power wire 62 is matched with its own ground wire 60 or a combination of ground wires 60. Flexible cable connector 14 is flexible and resilient so that it can be manipulated into various curved structures.

Flexible cable connector 14 is independent (e.g. physically and electrically separated from) of first printed circuit board 30 (and second printed board 20) on which processor 16 is mounted. This configuration enables achieving the low inductance path through the multi-wire rolled sheet configuration of flexible cable connector 14 while also saving space within first printed circuit board 30 and saving space immediately adjacent to processor 16 on the surface of first printed circuit board.

The low inductance feature of flexible cable connector 14 enables power supply 16 to be placed at a location remote from processor 16 since flexible cable connector 14 minimizes an inductance loop that otherwise occur using conventional power connection schemes over extended distances when supplying power to processor 16. This feature enables memory 17 to be located immediately adjacent to processor 16 (as shown in FIG. 1), demonstrating physical separation of power supply 12 and processor 16 which are no longer co-located together on first printed circuit board 30 (or on second printed circuit board 20).

Figure 2A:
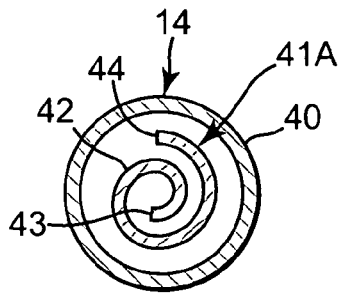
FIGS. 2A and 2B are sectional views of FIG. 1 of the flexible cable connector, according to an embodiment of the present invention.

FIG. 2A is a sectional view of flexible cable connector 14. FIG. 2A illustrates flexible connector 14 being configured as a cable and comprising insulator jacket 40 and power distribution sheet 42 that has been manipulated into rolled configuration 41A. Jacket 40 electrically insulates power distribution sheet 42 from a surrounding electrically active environment, such as first printed circuit board 30 and second printed circuit board 20 and any circuit elements disposed on first and second printed circuit boards 30, 20. Power distribution sheet 42 comprises first side edge 43 and second side edge 44. As shown in FIG. 2A, first side edge 43 of sheet 42 is adjacent a cross-sectional center of flexible cable connector 14 and second side edge 44 of sheet 42 is adjacent an outer surface of flexible cable connector 14. Power distribution sheet 42 is arranged in rolled configuration 41A to permit sheet 42 to be more easily used as a cable by minimizing a cross-sectional profile of flexible connector 14 and by enhancing maneuverability of flexible connector 14 for routing over first printed circuit board 30.

Figure 2B:
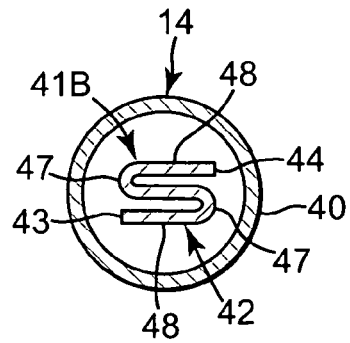

FIG. 2B illustrates another aspect of flexible cable connector 14 in which power distribution sheet 42 is manipulated into folded configuration 41B instead of rolled configuration 41A. However, in all other respects, flexible cable connector 14 shown in FIG. 2B has substantially the same features and attributes as flexible cable connector 14 shown in FIG. 2A. As shown in FIG. 2B, power distribution sheet 42 in folded configuration 41B comprises first edge 43, second edge 44, fold lines 47, and flaps 48. Power distribution sheet 42 is folded from a generally flat configuration (FIG. 3) into folded configuration 41B by folding flaps 48 relative to other portions of sheet 42 along fold lines 47 that extend generally parallel to a longitudinal axis of sheet 42 (see axis A in FIG. 3) and thereby generally parallel to a length of flexible cable connector 14. Flaps 48 are folded to have a Chinese-fan configuration (as shown) in which flaps 48 are folded to be away from each other, or optionally can be folded like a letter so that flaps 48 rest on top of each other. Other folding configurations can be implemented with the resulting configuration yielding a smaller cross-sectional profile to reduce the diameter of flexible cable connector 14 and such that the configuration enhances flexibility and maneuverability of flexible cable connector 14.

Figure 3:
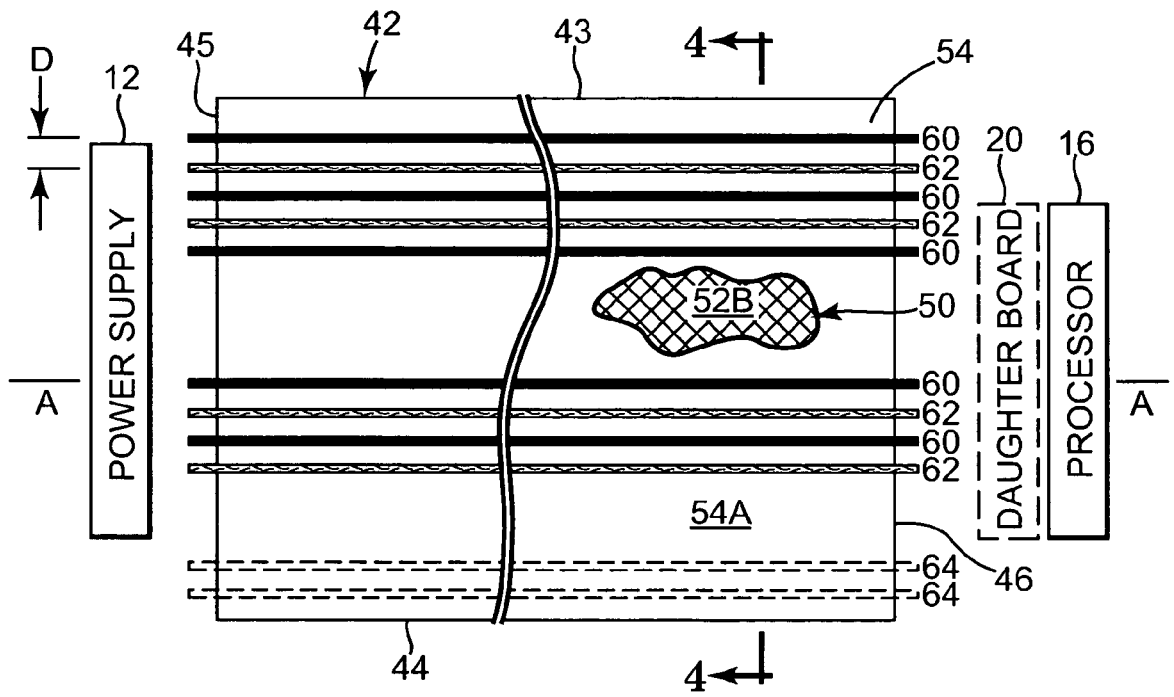
FIG. 3 is a plan view of a power distribution sheet of the flexible cable connector, according to an embodiment of the present invention.
Figure 4:
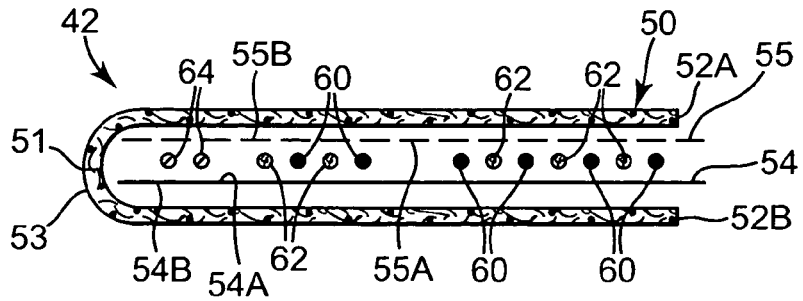
FIG. 4 is a sectional view of FIG. 3, according to an embodiment of the present invention.

FIGS. 3 and 4 illustrate power distribution sheet 42 in its unrolled configuration, i.e., at a point in time prior to being rolled into the rolled configuration that is shown in FIG. 2. FIG. 3 is a plan view of power distribution sheet 42 with second ground shield 52 removed for illustrative purposes to reveal the structures seen in FIG. 3. FIG. 4 is a sectional view of FIG. 3 as taken along lines 4—4, and which illustrates second ground shield 52 in its original location (i.e., prior to its removal in FIG. 3 for illustrative purposes). In addition, FIG. 4 illustrates the elements of power distribution sheet 42 in an enlarged view to better illustrate each of the elements and their respective relationships. However, when fully assembled, elements of power distribution sheet 42 are compressed together to define a sheet-like low profile singular unit.

As shown in FIG. 3, power distribution sheet 42 is an elongate member comprising first end 45 and second end 46, with first end 44 electrically connected to power supply 12 and second end 46 electrically connected to processor 16. Second end of sheet 42 is optionally connected to processor 16 via optional daughter board 20 including capacitive coupler 22 (as shown in FIG. 1).

Power distribution sheet 42 of flexible cable connector 14 comprises ground structure 50 and a plurality of insulated power wire(s) 62, and optional signal wire(s) 64. Ground structure 50 acts a return path for current between processor 16 and power supply 12. Ground structure 50 comprises a ground shield including first ground shield portion 52B and second ground shield portion 52A (FIG. 4), as well as optionally comprising a plurality of ground wires 60. Later embodiments shown in FIGS. 10–11 describe and illustrate an aspect of ground structure 50 that omits a plurality of ground wires 60 that are distinct from first and second ground shield portions 52B, 52A.

As shown in FIG. 4, first ground shield portion 52B and second ground shield portion 52A are made of a braided metal mesh, a solid metal material (e.g. thin metal foil), or other known flexible grounding materials. As shown in FIG. 4, first ground shield 52B and second ground shield 52A are defined as a single member. However, first ground shield portion 52B and second ground shield portion 52A are optionally removably separable along separation line 51 adjacent side edge 53 to form two physically separate portions. Moreover, as later shown in FIG. 7, first ground shield portion 52B and second ground shield portion 52A are also optionally defined as physically separate members rather than a single member that is separable into two distinct portions. In any case, whether physically separated or not, first and second ground shield portions 52B, 52A define a single ground shield for surrounding power wires 62 (and optionally ground wires 60) and act as part or all of ground structure 50 to provide a return current path between processor 16 and power supply 12.

As further shown in FIG. 4, power distribution sheet 42 further comprises first adhesive sheet 54 and optional second adhesive sheet 55. As seen in FIG. 3, a portion of first adhesive sheet 54 is removed for illustrative purposes to reveal first ground shield 52B.

As shown in FIG. 3, in this embodiment of flexible cable connector 14, ground structure 50 includes ground shield portions 52B, 52A and ground wires 60, which are aligned generally parallel to a longitudinal axis (A) of power distribution sheet 42. Ground wires 60 also are aligned generally parallel to power wires 62 in a side-by-side alternating arrangement (e.g., ground, power, ground, power, etc.) so that each power wire 60 and ground wire 62 are spaced from each other by a fixed distance D. Ground wires 60 and power wires 62 are secured in this position by placement on first adhesive sheet 54.

First adhesive sheet 54 (and second adhesive sheet 55) comprises a thin, flexible sheet with two opposed surfaces with each surface bearing a pressure sensitive adhesive. For example, first and second adhesive sheets 54, 55 comprise an insulative polyimide tape available as Kapton® tape available from E. I. du Pont de Nemours and Company.

Because first adhesive sheet 54 comprises two opposed adhesive surfaces, first surface 54A of first adhesive sheet 54 secures power wires 62 and ground wires 60 to first adhesive sheet 54 while second surface 54B of first adhesive sheet 54 secures first adhesive sheet 54 to first ground shield 50. When second ground shield 52 is pressed downwardly onto power wires 62, ground wires 60, and first surface 54A of first adhesive sheet 54, then second ground shield 52 becomes secured to first adhesive sheet 54 upon pressing contact with exposed portions (e.g., first surface 54A) of first adhesive sheet 54. Securing second ground shield 52 to first adhesive sheet 54 in this manner further maintains power wires 62 and ground wires 60 in their generally parallel, side-by-side, alternating arrangement on first adhesive sheet 54.

In addition, power distribution sheet 42 further optionally comprises second adhesive sheet 55. Optional second adhesive sheet 55 comprises two opposed adhesive surfaces, first surface 55A of second adhesive sheet 55 for additionally securing power wires 62 and ground wires 60 (in their generally parallel, side-by-side alternating arrangement) to second adhesive sheet 55 while second surface 55B of second adhesive sheet 55 secures second adhesive sheet 55 to second ground shield 52. However, even though second adhesive sheet 55 is added, power wires 62 and ground wires 60 are still secured to first adhesive sheet 54. First and second adhesive sheets 54 and 55 are optionally provided as a single adhesive insulative sheet.

Optional signal wires 64 carry control and monitoring signals between processor 16 and power supply 12, and also are aligned generally parallel to the set of power wires 62 and ground wires 60 in a side-by-side relationship.

Power wires 62 and ground wires 60 are arranged together in a side-by-side structure so that each power wire 62 has a complementary ground wire 60 to act as a ground return path for current. Signal wires 64 can be disposed at any location among multiple ground and power wires 60, 62. Finally more than one ground wire 60 can be placed between respective power wires 62 or signal wires 64 to provide each power plane with its own return ground return path.

To achieve a minimal inductance loop via power distribution sheet 42 of flexible connector(s) 14, the number of power wires 62, and ground wires 60 of flexible connector(s) 14 can be varied based on a length of flexible connector(s) 42, the power and current requirements of processor 16, and the characteristics and placement of power supply 12, as well as the number and type of desired power planes. A greater number of power wires 62 and return ground wires 60 generally aids in further minimizing the inductance loop between power supply 12 and processor 16.

Whether configured as a single member or separated, first ground shield portion 52B and second ground shield portion 52A electrically define the same or single ground reference, and act to shield power wires 62 (and optionally ground wires 60) from external electrical environments such as electromagnetic forces (EMF) adjacent flexible cable connector 14.

Other aspects of ground structure 50, specifically including various combinations of ground wires 60 as implemented with power wires 62 of flexible cable connector 14 are later described and illustrated in FIGS. 7–11.

Figure 6:
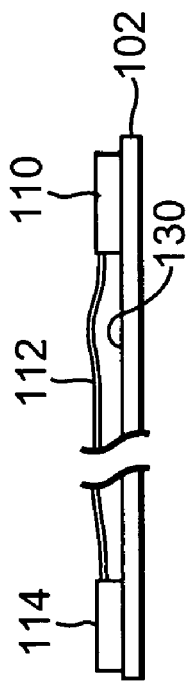
FIG. 6 is a partial side view of FIG. 5, according to an embodiment of the present invention.

FIGS. 5 and 6 illustrate an alternate embodiment for implementing flexible cable connector 14 as a low inductance path in which a power supply is not located on the same circuit card (e.g. motherboard, server card, etc) as the processor.

FIG. 5 is a plan view of a circuit card system 100. As shown in FIG. 5, system 100 comprises circuit card 102 and chassis 104. Circuit card 102 comprises processor 110, flexible connector 112, and bus 114 while chassis 104 comprises power supply 120 and bus 122.

Circuit card 102 comprises a blade server, a brick server, or other circuit card that is removably insertable into chassis 104 wherein chassis 104 provides power to circuit card 102 from power supply 120 via buses 114 and 122.

System 100 comprises substantially all of the same features and attributes of system 10 of FIGS. 1–2, except that power supply 120 is not located on the same printed circuit board as processor 110. In particular, flexible connector 112 comprises substantially all the same features and attributes of flexible cable connector 14. In addition, processor 110 also optionally is mounted on daughterboard (such as second printed circuit board 20 in FIG. 1), which would in turn be mounted on circuit card 102. Moreover, with or without a daughterboard, processor 110 is optionally connected to flexible connector 112 via a capacitive coupler, in a manner substantially similar to the use of capacitive coupler 22, as described and illustrated in association with FIG. 1.

As shown in FIG. 5, first end 130 of flexible connector 112 is electrically connected to processor 110 and second end 132 of flexible connector 112 is electrically connected to bus 114 of circuit card 102. Bus 114 includes a connector port for receiving second end 132 of flexible connector 112. When circuit card 102 is removably connected to chassis 104, bus 114 of circuit card 102 is electrically and mechanically connected to bus 122 of chassis 104 to thereby connect power supply 120 to processor 110 via flexible connector 112.

Accordingly, flexible connector 112 enables a low inductance path for power between a processor and a power supply even when the power supply is not located on the same circuit card as the processor. This feature makes flexible cable connector 14 well suited for use in high density computing, such as blade server systems.

FIG. 6 is a partial side view of FIG. 5 that illustrates the physical separation between flexible connector 112 and circuit card 102. As shown in FIG. 6, flexible connector 112 extends between bus 114 and processor 110. Flexible connector 112 is separate from and is spaced above a surface 130 of circuit card 102 (e.g. printed circuit board) so that power planes and return ground planes defined by power wires 62 and ground wires 60, respectively, of flexible connector 112 do not pass through server card 102 between processor 110 and power supply 114.

Figure 7:
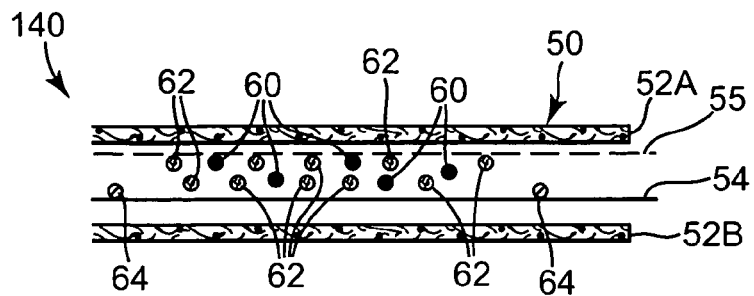
FIG. 7 is a sectional view of FIG. 3 of an alternate power distribution sheet of a flexible cable connector, according to an embodiment of the present invention.

An alternate embodiment of flexible cable connector 14 comprises power distribution sheet 140, which is shown in FIG. 7. Power distribution sheet 140 has substantially the same features and attributes as power distribution sheet 42 (FIG. 2–4) except for ground structure 50 including a different arrangement of ground wires 60 relative to power wires 62. In this arrangement, power wires 62 are interspersed among a latticework of ground wires 60 such that ground wires 60 are disposed in between, over, and around power wires 62. As before, both ground wires 60 and power wires 62 are secured in place by first adhesive sheet 50 and second adhesive sheet 52.

Figure 8:
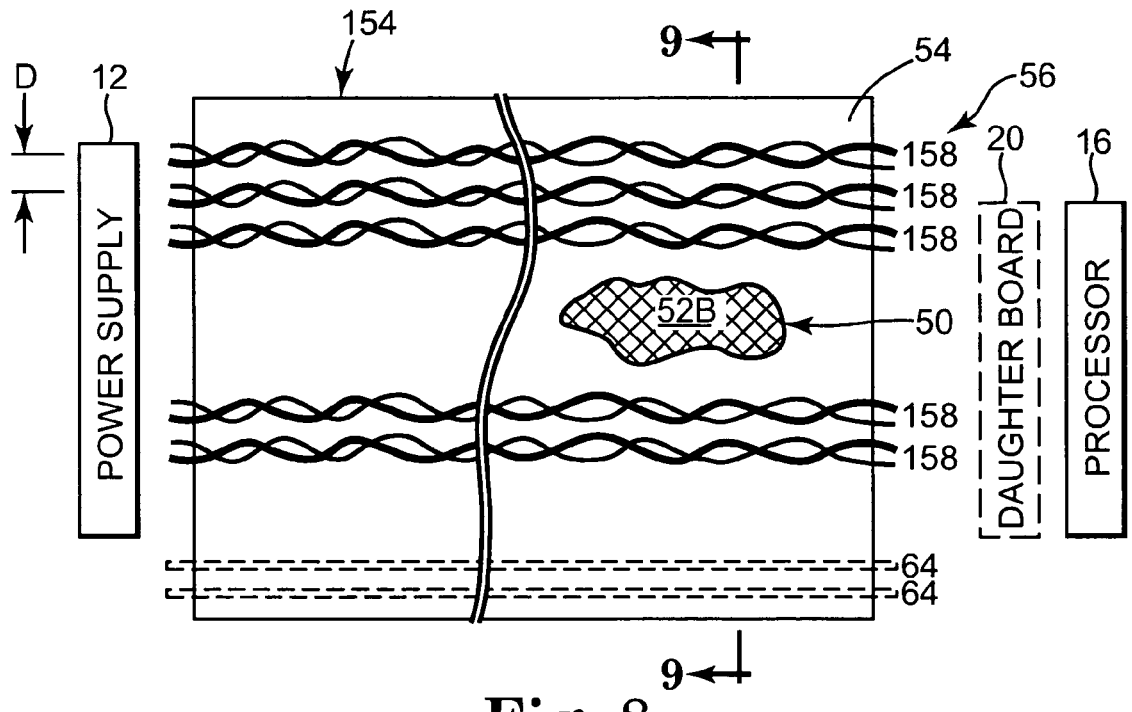
FIG. 8 is a plan view of a power distribution sheet of an alternate flexible connector, according to an embodiment of the present invention.
Figure 9:
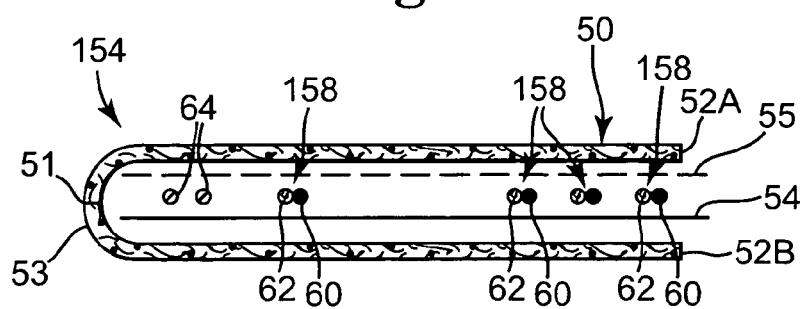
FIG. 9 is a sectional view of FIG. 8, according to an embodiment of the present invention.

FIGS. 8 and 9 illustrate an alternate embodiment of flexible cable connector 14 comprising power distribution sheet 154. As shown in FIGS. 8–9, power distribution sheet 154 has substantially the same features and attributes as power distribution sheet 42 (FIGS. 2–4) except that ground structure 50 comprises ground wires 60 of ground structure 50 being incorporated along with power wires 62 as twisted wire pairs 158. Each twisted wire pair 158 comprises a single insulated power wire 62 and a single ground wire 60 assembled together in the form of a twisted pair. A twisted wire pair configuration for general purposes (e.g. telephone lines) is known to those skilled in the art. Physically coupling an insulated power wire 62 and a ground wire 60 in a pair insures that each power wire 62 has its own ground wire 60 for a ground return path for current, and also simplifies assembly of power distribution sheet 154 because multiple twisted pairs can be laid out on adhesive sheet 54 more simply than individual power wires 62 and ground wires 60 (as in FIG. 3–4). Moreover, each twisted pair 158 can carry a single voltage so that with a plurality of the twisted pairs 158, several different voltages can be carried by flexible cable connector 14. In addition, the twisted pair configuration including a dedicated ground path for each power wire 62 enables careful management of the voltage level and managing low power consumption. Finally, twisted pairs 158 of insulated power wires 62 and ground wires 60 reduce noise.

As shown in FIG. 8, twisted wire pairs 158 are aligned generally parallel to each other in a side-by-side relationship with a fixed distance D between respective twisted wire pairs 158.

Figure 10:
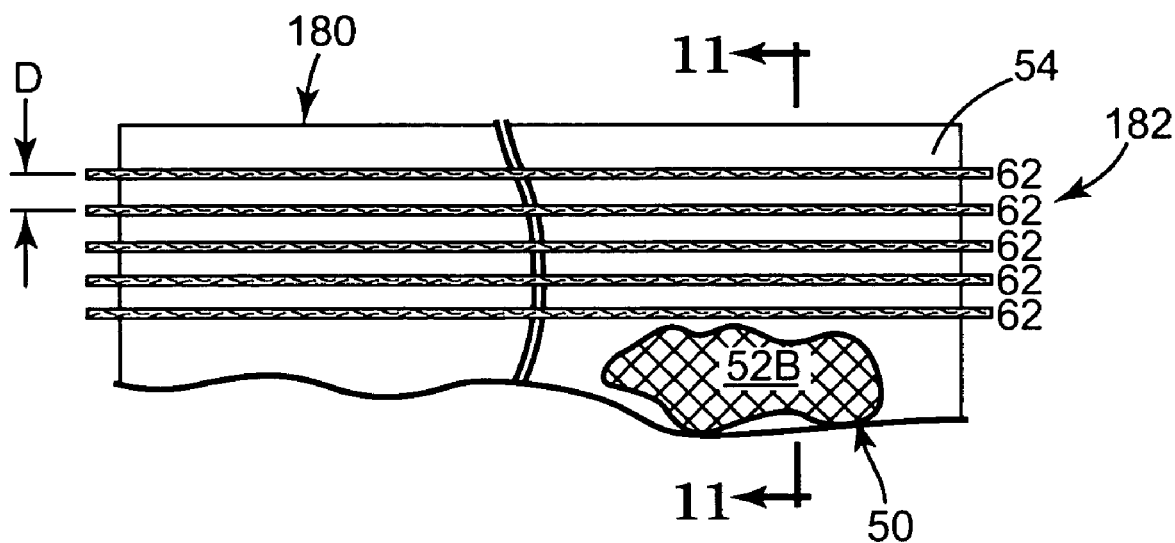
FIG. 10 is a plan view of a power distribution sheet of an alternate flexible connector, according to an embodiment of the present invention.

Accordingly, twisted wire pairs 158 can be combined with other aspects of flexible cable connector 14 such as the ground structure arrangements of FIGS. 3, 7, and 10, so that multiple aspects of ground structure 50 are combined in a single flexible cable connector 14. For example, twisted wire pairs 158 can be arranged as part of a power distribution sheet 42 (FIG. 3), power distribution sheet 140 (FIG. 7), or power distribution sheet 180 (FIG. 10) such that twisted wire pairs 158 are interposed amongst the generally parallel arrangement of power wires 62 and ground wires 60 (except for power sheet 180 which omits ground wires 60). In this manner, a single flexible cable connector 14 can optionally include one or more carefully regulated, different voltage levels provided by one or more twisted pairs 158, and the other insulated power wires 62 that are not in the twisted pair configuration.

Figure 11:
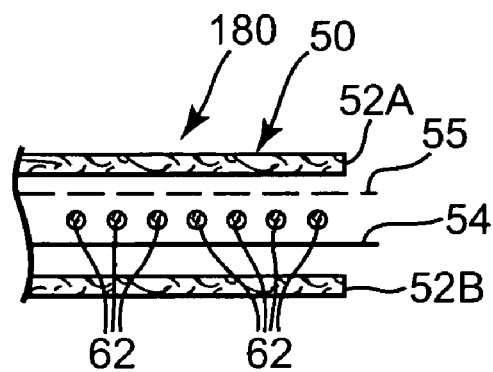
FIG. 11 is a sectional view of FIG. 10, according to an embodiment of the present invention.

FIGS. 10 and 11 also illustrate an alternate embodiment of flexible cable connector 14 comprising power distribution sheet 180. As shown in FIGS. 10–11, power distribution sheet 180 has substantially the same features and attributes as power distribution sheet 42 (FIGS. 2–4) except that ground structure 50 omits ground wires 60 from side-by-side placement next to power wires 62 and instead are embodied in first and second ground shield portions 52B, 52A. In particular, individual ground wires 60 are not placed on first adhesive sheet 52 adjacent to power wires 62. Instead, first ground shield 52B (and optionally second ground shield 52A), which is itself an aggregation of ground wires in the form of a braided mesh, provides a return ground path of current for power wires 62.

In this arrangement, insulated power wires 62 are still arranged in a side-by-side, generally parallel relationship with each other yet omitting an alternating relationship with ground wires 60. Insulated power wires 62 are also maintained, by their fixation on first adhesive sheet 52, at a fixed distance D from each other.

Like the embodiments of power distribution sheets 42, 140, 154 described and illustrated in association with FIGS. 3–4, 7–9, respectively, power distribution sheet 180 extends between power supply 12 and processor 16 (and optionally daughter board 20).

Embodiments of the present invention directed to a flexible cable connector provide a low inductance path between a power supply and a processor. The flexible cable connector enables locating the power supply remotely from the processor while still meeting the stringent power and current requirements of high end processors. Consequently, premium space that is closest to the processor can be used for memory, circuit traces, and other circuit elements instead of being used for a bulky power pod. Moreover, since the power supply no longer needs to be co-located with the processor, there is much greater freedom in laying out a printed circuit board to optimize placement of all the components of the printed circuit board.

While specific embodiments have been illustrated and described, herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A power distribution system comprising:
   a first printed circuit board
   a second printed circuit board mounted on the first printed circuit board, the second printed circuit board including a capacitive coupler;
   a power supply mounted on the first printed circuit board;
   a 64 bit processor mounted on the second printed circuit board, the 64 bit processor spaced remotely from the power supply; and
   a flexible cable connector comprising a first end and a second end, the first end electrically connected to the processor via the capacitive coupler of the second printed circuit board and the second end electrically connected to the power supply, the flexible connector configured with a length to cause the remote spacing of the power supply relative to the 64 bit processor, the flexible connector extending between the power supply and the 64 bit processor independent of the first printed circuit board with the flexible connector including:
   a plurality of insulated power wires arranged generally parallel to each other extending from the first end to the second end of the flexible cable connector; and
   a ground structure including a ground shield that surrounds the plurality of insulated power wires and extends from the first end to the second end of the flexible cable connector, with the ground structure configured to provide a return path for current between the 64 bit processor and the power supply.

2. The system of claim 1 wherein the ground shield comprises at least one of:
   a single shield portion;
   a first shield portion and a second shield portion removably separable from the first shield portion; and
   the first shield portion and the second shield portion separate from the first shield portion.

3. The system of claim 1 wherein the ground structure comprises:
   a plurality of ground wires arranged generally parallel to the plurality of insulated power wires, extending from the first end to the second end of the connector, in a side-by-side, alternating relationship with the plurality of power wires, wherein both the plurality of ground wires and power wires are surrounded by the ground shield.

4. The system of claim 1 wherein the ground structure comprises the ground shield acting as the return current path between the 64 bit processor and the power supply.

5. The system of claim 1 wherein the ground structure and the plurality of insulated power wires define a single flexible sheet which is configured with a first side edge, a second side edge, and a body portion extending between the first and second side edges, and wherein the single flexible sheet is in a rolled configuration with the first side edge disposed in a center of the rolled configuration and the second side edge disposed at an outer surface of the rolled configuration.

6. The system of claim 1 and further comprising:
   an adhesive insulator sheet sandwiched between the ground shield and the generally parallel arrangement of the power wires, and including a first adhesive surface for securing the power wires to the adhesive insulator sheet and a second opposite adhesive surface for securing the adhesive insulator sheet to the ground shield.

7. The power distribution system of claim 1 wherein the ground structure and the plurality of insulated power wires define a single flexible sheet arranged in a folded configuration.

8. A power distribution system comprising:
   a first printed circuit board;
   a power supply mounted on the first printed circuit board;
   a processor mounted on the first printed circuit board; and
   a flexible cable connector comprising a first end electrically connected to the processor and a second end electrically connected to the power supply and configured with a length so that the power supply is in a spaced relationship relative to the processor, the flexible connector extending between the power supply and the processor independent of the first printed circuit board and including:
   a plurality of insulated power wires arranged generally parallel to each other extending from the first end to the second end of the flexible cable connector; and
   a ground structure including a ground shield that surrounds the plurality of insulated power wires and extends from the first end to the second end of the flexible cable connector, with the ground structure configured to provide a return path for current between the processor and the power supply; and
   wherein the ground structure and the plurality of insulated power wires define a single flexible sheet which is configured with a first side edge, a second side edge, and a body portion extending between the first and second side edges, and wherein the single flexible sheet is in a rolled configuration with the first side edge disposed in a center of the rolled configuration and the second side edge disposed at an outer surface of the rolled configuration.

9. A high density computing system comprising:
   a motherboard and a daughterboard mounted on the motherboard;
   a power supply mounted on the motherboard;
   a high-end processor mounted on the daughterboard, the high-end processor including a high power parameter and a stringent current parameter; and
   a flexible cable connector comprising a first end electrically connected to the high-end processor and a second end electrically connected to the power supply and configured with a length so that the power supply is in a spaced relationship relative to the high-end processor, the flexible connector extending between the power supply and the high-end processor independent of the first printed circuit board and the flexible connector including:
   a plurality of insulated power wires arranged generally parallel to each other extending from the first end to the second end of the flexible cable connector; and
   a ground structure including a ground shield that surrounds the plurality of insulated power wires and extends from the first end to the second end of the flexible cable connector, with the ground structure configured to provide a return path for current between the high-end processor and the power supply.

10. The high density computing system of claim 9 wherein the high-end processor comprises a 64-bit central processor unit.

* * * * *

UNITED STATES PATENT AND TRADEMARK OFFICE
CERTIFICATE OF CORRECTION

PATENT NO. : 7,187,556 B2  Page 1 of 1
APPLICATION NO. : 10/684646
DATED : March 6, 2007
INVENTOR(S) : Andrew Barr et al.

It is certified that error appears in the above-identified patent and that said Letters Patent is hereby corrected as shown below:

On page 2, in field (56), under "U.S. PATENT DOCUMENTS", in column 1, line 7, delete "2003/0158400" and insert -- 2003/0156400 --, therefor.

Signed and Sealed this

Twenty-ninth Day of December, 2009

David J. Kappos
*Director of the United States Patent and Trademark Office*